United States Patent
Imaoka

(10) Patent No.: US 6,380,814 B1
(45) Date of Patent: Apr. 30, 2002

(54) VOLTAGE-CONTROLLED OSCILLATOR HAVING A VARIABLE CAPACITIVE ELEMENT WITH AN ELECTRODE COUPLED TO A RESONATOR

(75) Inventor: Toshikazu Imaoka, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/711,083

(22) Filed: Nov. 14, 2000

(30) Foreign Application Priority Data

Nov. 17, 1999 (JP) .......................................... 11-327425

(51) Int. Cl.$^7$ ................................................ H03B 5/18
(52) U.S. Cl. ............... 331/96; 331/177 V; 331/107 SL; 331/107 DP; 331/333; 331/205; 331/219.1
(58) Field of Search .............................. 333/205, 219.1; 331/96, 107 SL, 177 V, 107 DP

(56) References Cited

U.S. PATENT DOCUMENTS 4,871,983 A * 10/1989 Graycar ....................... 331/96
5,045,815 A * 9/1991 Avanic et al. ................ 331/96

FOREIGN PATENT DOCUMENTS

| JP | 57-87209 | 5/1982 |
| JP | 04-223601 | 8/1992 |

\* cited by examiner

Primary Examiner—Arnold Kinkead
(74) Attorney, Agent, or Firm—Armstrong, Westerman & Hattori, LLP

(57) ABSTRACT

A dielectric resonator is formed on a dielectric substrate. A pair of microstrip lines is formed to be electromagnetically coupled with the dielectric resonator. An end of each of the microstrip lines is open to define an open end while another end is arranged to approximate to the dielectric resonator for defining a node. A cathode and an anode of a varactor diode are connected to the node of each of the microstrip lines respectively.

16 Claims, 11 Drawing Sheets

F I G. 1
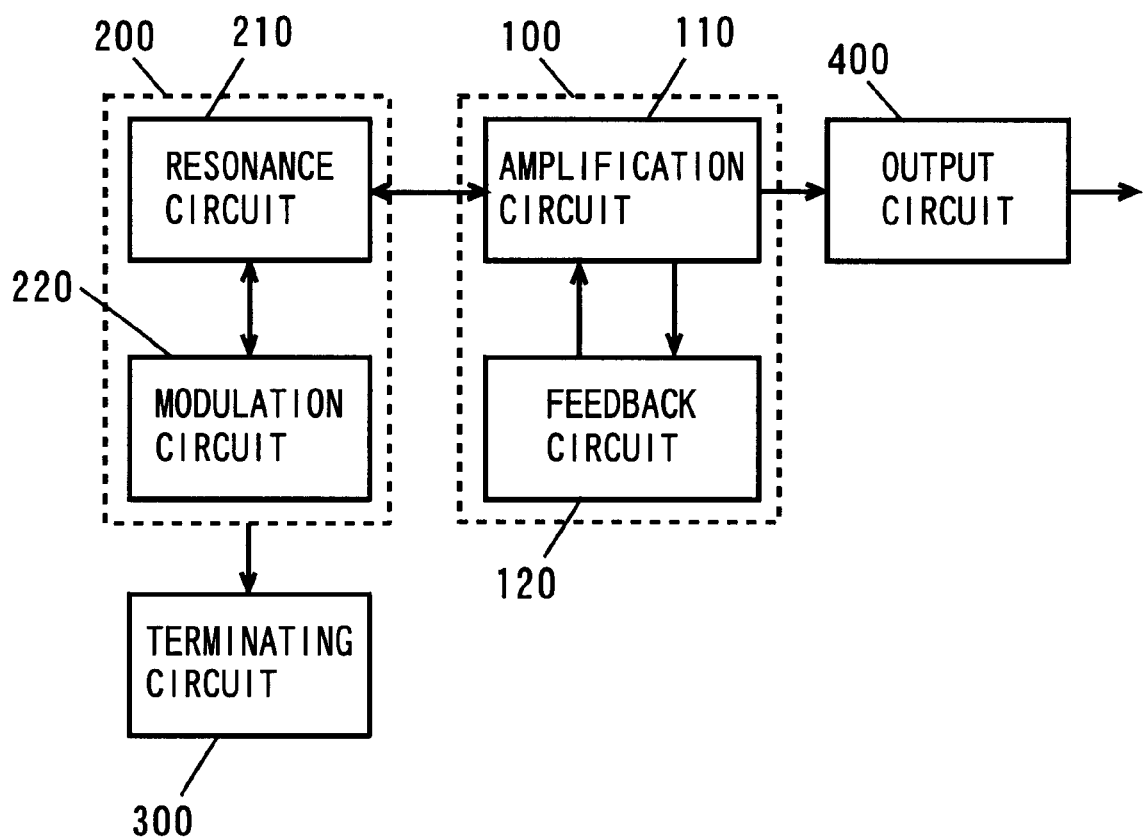

VOLTAGE-CONTROLLED OSCILLATOR HAVING A VARIABLE CAPACITIVE ELEMENT WITH AN ELECTRODE COUPLED TO A RESONATOR

BACKGROUND OF THE INVENTION

1. Field of the Invention

The present invention relates to a voltage-controlled oscillator capable of varying its oscillation frequency by voltage control and a communication device employing the same.

2. Description of the Prior Art

In general, a voltage-controlled oscillator employing a variable capacitive element such as a varactor diode is proposed. FIG. 14 is a plan view of a conventional voltage-controlled oscillator disclosed in Japanese Patent Laying-Open No. 57-87209 (1982).

Referring to FIG. 14, a metal-semiconductor field-effect transistor (MESFET; hereinafter referred to as a transistor) 55 is formed on a dielectric substrate 51. Microstrip lines 52, 53 and 54 connected with a source electrode S, a gate electrode G and a drain electrode D of the transistor 55 respectively are also formed on the dielectric substrate 51. A gate-side stabilizing resistor 57 is connected to an end of the microstrip line 53.

A dielectric resonator 56 is arranged on the dielectric substrate 51 to be electromagnetically coupled with the microstrip lines 53 and 54. A further microstrip line 59 is formed on the dielectric substrate 51 to be electromagnetically coupled with the dielectric resonator 56. This microstrip line 59 has a length half the wavelength corresponding to a prescribed frequency (this wavelength is hereinafter referred to as a half wavelength), and approximates to the dielectric resonator 56 on its middle point. Thus, the middle point of the microstrip line 59 defines a node 70 with the dielectric resonator 56.

A first end 59a of the microstrip line 59 is open. A further microstrip line 60 is arranged on a second end 59b of the microstrip line 59 through a varactor diode 58. The microstrip line 60 has a length quarter the wavelength corresponding to the prescribed frequency (this length is hereinafter referred to as a quarter wavelength).

A cathode C of the varactor diode 58 is connected to the second end 59b of the microstrip line 59, and an anode A is connected to a first end 60a of the microstrip line 60. A second end 60b of the microstrip line 60 is open.

In the voltage-controlled oscillator shown in FIG. 14, the transistor 55 amplifies a small microwave signal generated on the gate electrode G and outputs the amplified microwave signal to the drain electrode D. The microstrip lines 54 and 53 and the dielectric resonator 56 form a band-pass filter. The microwave signal output to the drain electrode D is positively fed back to the gate electrode G through this band-pass filter. Thus, microwave power oscillating at a constant oscillation frequency is obtained. This oscillation frequency depends on the resonance frequency of the dielectric resonator 56.

A control voltage is applied across the cathode C and the anode A of the varactor diode 58. The capacitance value of the varactor diode 58 varies with the control voltage applied across the cathode C and the anode A.

The dielectric resonator 56 and the microstrip line 59 are electromagnetically coupled with each other, and the resonance frequency of the dielectric resonator 56 varies with the capacitance value of the varactor diode 58. Therefore, this voltage-controlled oscillator can vary the oscillation frequency by changing the control voltage applied across the cathode C and the anode A.

In the aforementioned conventional voltage-controlled oscillator, the microstrip line 59 has the length corresponding to the half wavelength and the open first end 59a, and hence the central node 70 is shorted (in a shorted state) in a high-frequency manner while the second end 59b is open (in an open state) in a high-frequency manner. The microstrip line 60 has the quarter wavelength and the open second end 60b, and hence the first end 60a is shorted (in a shorted state) in a high-frequency manner.

In such a structure of the voltage-controlled oscillator, the dielectric resonator 56 is electromagnetically coupled with the varactor diode 58 through the microstrip line 59 and hence the microwave power oscillating at the constant oscillation frequency partially reaches the varactor diode 58. The anode A of the varactor diode 58 is grounded in a high-frequency manner so that the potential thereof is regularly kept at zero. On the other hand, the cathode C of the varactor diode 58 is open in a high-frequency manner, and hence a voltage resulting from the microwave power is superposed on the control voltage. Thus, the following potential difference $V_{va}$ is caused between the cathode C and the anode A of the varactor diode 58:

$$V_{va} = V_c + V_{po} \cdot \sin(2\pi ft)$$

where $V_c$ represents the control voltage applied across the cathode C and the anode A of the varactor diode 58, f represents the oscillation frequency, $V_{po}$ represents the amplitude of the voltage resulting from the microwave power oscillating at the oscillation frequency f and t represents the time.

As understood from the above equation, the potential difference $V_{va}$ between the cathode C and the anode A of the varactor diode 58 fluctuates, followed by fluctuation of the capacitance value of the varactor diode 58. Consequently, the oscillation frequency f also fluctuates to deteriorate phase noise characteristics of oscillating waves as a result.

The capacitance value of the varactor diode 58 is nonlinear with respect to the voltage. When the potential difference between the cathode C and the anode A of the varactor diode 58 having such nonlinearity fluctuates, baseband noise of the transistor 55 and the varactor diode 58 is converted to a frequency close to the oscillation frequency f, to deteriorate the phase noise characteristics of the oscillating waves as a result. As the dielectric resonator 56 and the microstrip line 59 are strongly coupled with each other, the part of the microwave power reaching the varactor diode 58 increases to more remarkably deteriorate the phase noise characteristics.

In order to reduce such deterioration of the phase noise characteristics caused by the voltage superposed on the controlled voltage for the varactor diode, a countermeasure of connecting two varactor diodes in parallel with each other in opposite polarity is proposed as disclosed in Japanese Patent Laying-Open No. 4-223601 (1192), for example.

However, this structure requires two varactor diodes having completely identical voltage dependency of capacitance values. If the capacitance values of the varactor diodes are asymmetrical with respect to a control voltage, the composite capacitance value of the two varactor diodes fluctuates due to fluctuation of potential differences between cathodes and anodes. Thus, this means cannot solve the problem of fluctuation of the oscillation frequency.

SUMMARY OF THE INVENTION

An object of the present invention is to provide a voltage-controlled oscillator reduced in deterioration of phase noise characteristics.

Another object of the present invention is to provide a communication device having a high communication quality resulting from a reduction in deterioration of phase noise characteristics.

A voltage-controlled oscillator according to an aspect of the present invention comprises an oscillation part performing oscillation, a resonance circuit resonating with the oscillation frequency of the oscillation part and a modulation circuit for modulating the oscillation frequency of the oscillation part within an oscillation band by changing the resonance frequency of the resonance circuit, while the modulation circuit includes a coupling part coupled with the resonance circuit in a high-frequency manner and a variable capacitive element having a pair of electrodes subjected to application of a control voltage, and the input impedance of the coupling part as viewed from the side of the resonance circuit at a frequency within the oscillation band is substantially set in a shorted state while one of the pair of electrodes of the variable capacitive element is connected to the coupling part.

In this voltage-controlled oscillator, the resonance circuit resonates with the oscillation frequency of the oscillation part. When changing the control voltage applied across the pair of electrodes of the variable capacitive element in the modulation circuit, the resonance frequency of the resonance circuit changes to modulate the oscillation frequency of the oscillation part within the oscillation band.

In this case, the input impedance of the coupling part as viewed from the side of the resonance circuit at the frequency within the oscillation band is substantially set in a shorted state. Also when power oscillating at the oscillation frequency partially reaches the coupling part of the modulation circuit, therefore, fluctuation of the potential of the coupling part is suppressed. Thus, the potential difference between the pair of electrodes of the variable capacitive element is kept constant and the capacitive element is prevented from fluctuation of its capacitance value. Therefore, the oscillation frequency does not fluctuate, not to deteriorate phase noise characteristics as a result.

The potential difference between the pair of electrodes of the variable capacitive element is kept constant, whereby baseband noise of the oscillation part and the variable capacitive element is prevented from being converted to a frequency around the oscillation frequency due to nonlinearity between the capacitance value of the variable capacitive element and the voltage, not to deteriorate the phase noise characteristics of oscillating waves as a result. Accordingly, a deterioration in a communication quality resulting from a deterioration in phase noise characteristics in a communication device.

The resonance circuit may include a resonance element formed by a cylindrical dielectric material or a discoidal conductive material, and the coupling part may be electromagnetically coupled with the resonance circuit.

The modulation circuit may further include a transmission line having an open end and the coupling part, and the length between the open end and the coupling part of the transmission line may be approximately set to odd times a quarter of an effective wavelength corresponding to a frequency within the oscillation band. Thus, the input impedance of the coupling part as viewed from the side of the resonance circuit at the frequency within the oscillation band is substantially shorted.

When the length of the transmission line increases, the occupied area as well as transmission loss also increase to lower the Q (quality factor) of the circuit and deteriorate noise characteristics. Therefore, the length between the open end and the coupling part of the transmission line is preferably set around quarter the effective wavelength corresponding to the frequency within the oscillation band.

The length between the open end and the coupling part of the transmission line may be set shorter than the odd times a quarter of the effective wavelength corresponding to the frequency within the oscillation band. Thus, when the transmission line is effectively extended due to capacitance present on the open end of the transmission line, the input impedance of the coupling part as viewed from the side of the resonance circuit at the frequency within the oscillation band is substantially shorted.

The length between an open end of the transmission line effectively extended due to capacitance present on the open end of the transmission line and the coupling part may be set to odd times a quarter of the effective wavelength corresponding to the frequency within the oscillation band. Thus, when capacitance is present on the open end of the transmission line, the input impedance of the coupling part as viewed from the side of the resonance circuit at the frequency within the oscillation band is substantially shorted.

The variable capacitive element may be a varactor diode. Further, the transmission line may be a microstrip line.

A voltage-controlled oscillator according to another aspect of the present invention comprises an oscillation part performing oscillation, a resonance circuit resonating with the oscillation frequency of the oscillation part and a modulation circuit for modulating the oscillation frequency of the oscillation part within an oscillation band by changing the resonance frequency of the resonance circuit, while the modulation circuit includes a pair of coupling parts coupled with the resonance circuit in a high-frequency manner and a variable capacitive element having a pair of electrodes subjected to application of a control voltage, and the pair of electrodes of the variable capacitive element are connected to the pair of coupling parts respectively.

In this voltage-controlled oscillator, the resonance circuit resonates with the oscillation frequency of the oscillation part. When changing the control voltage applied across the pair of electrodes of the variable capacitive element in the modulation circuit, the resonance frequency of the resonance circuit changes to modulate the oscillation frequency of the oscillation part within the oscillation band.

The pair of coupling parts of the modulation circuit are coupled with the resonance circuit in a high-frequency manner. When power oscillating at a constant oscillation frequency partially reaches the pair of coupling parts of the modulation circuit, therefore, a voltage resulting from the oscillation power is equally supplied to the pair of electrodes of the variable capacitive element. Thus, the potential difference between the pair of electrodes of the variable capacitive element is kept constant and the capacitance of the variable capacitive element does not fluctuate. Therefore, the oscillation frequency does not fluctuate, not to deteriorate phase noise characteristics as a result.

The potential difference between the pair of electrodes of the variable capacitive element is kept constant, whereby baseband noise of the oscillation part and the variable capacitive element is prevented from being converted to a frequency around the oscillation frequency due to nonlinearity between the capacitance value of the variable capacitive element and the voltage, not to deteriorate phase noise characteristics of oscillating waves as a result.

The input impedances of the pair of coupling parts as viewed from the side of the resonance circuit at a frequency within the oscillation band may be substantially set in shorted states respectively.

In this case, the potentials of the pair of coupling parts are inhibited from fluctuation and the potential difference between the pair of electrodes of the variable capacitive element is kept constant also when different voltages are supplied to the pair of coupling parts of the modulation circuit due to the oscillation power. Consequently, the variable capacitive element is reliably prevented from fluctuation of the capacitance value.

The resonance circuit may include a resonance element formed by a cylindrical dielectric material or a discoidal conductive material, and the pair of coupling parts may be electromagnetically coupled with the resonance element.

The modulation circuit may further include a pair of transmission lines, the first one of the pair of transmission lines may have an open end and the first one of the pair of coupling parts, and the second one of the pair of transmission lines may have an open end and the second one of the pair of coupling parts.

The length between the open end and the first coupling part of the first transmission line may be equal to the length between the open end and the second coupling part of the second transmission line. In this case, the potential difference between the pair of electrodes of the variable capacitive element can be kept constant by equally setting coupling between the resonance circuit and the first coupling part and coupling between the resonance circuit and the second coupling part.

The length between the open end and the first coupling part of the first transmission line may be different from the length between the open end and the second coupling part of the second transmission line. In this case, the potential difference between the pair of electrodes of the variable capacitive element can be kept constant by differently setting coupling between the resonance circuit and the first coupling part and coupling between the resonance circuit and the second coupling part.

The resonance circuit may include a distributed constant element. In this case, a distributed constant line forms the resonance circuit.

The resonance circuit may include a lumped constant element. In this case, a lumped constant circuit forms the resonance circuit.

The variable capacitive element may be a varactor diode. Further, the transmission lines may be microstrip lines.

A communication device according to still another aspect of the present invention comprises a local oscillator including a voltage-controlled oscillator generating a reference signal and a frequency converter mixing the reference signal generated by the local oscillator with a transmitted signal or a received signal thereby converting the frequency of the transmitted signal or the received signal to a prescribed frequency, while the voltage-controlled oscillator includes an oscillation part performing oscillation, a resonance circuit resonating with the oscillation frequency of the oscillation part and a modulation circuit for modulating the oscillation frequency of the oscillation part within an oscillation band by changing the resonance frequency of the resonance circuit, the modulation circuit includes a coupling part coupled with the resonance circuit in a high-frequency manner and a variable capacitive element having a pair of electrodes subjected to application of a control voltage, and the input impedance of the coupling part as viewed from the side of the resonance circuit at a frequency within the oscillation band is substantially set in a shorted state while one of the pair of electrodes of the variable capacitive element is connected to the coupling part. Accordingly, a deterioration in a communication quality resulting from a deterioration in phase noise characteristics in the communication device.

In the voltage-controlled oscillator of this communication device, the input impedance of the coupling part as viewed from the side of the resonance circuit at the frequency within the oscillation band is substantially set in a shorted state, whereby the coupling part of the modulation part is inhibited from potential fluctuation also when power oscillating at the oscillation frequency partially reaches the coupling part. Thus, the potential difference between the pair of electrodes of the variable capacitive element is kept constant and the variable capacitive element is prevented from fluctuation of the capacitance value. Therefore, the oscillation frequency does not fluctuate, not to deteriorate phase noise characteristics as a result.

The potential difference between the pair of electrodes of the variable capacitive element is kept constant, whereby baseband noise of the oscillation part and the variable capacitive element is prevented from being converted to a frequency around the oscillation frequency due to nonlinearity between the capacitance value of the variable capacitive element and the voltage, not to deteriorate phase noise characteristics of oscillating waves as a result.

A communication device according to a further aspect of the present invention comprises a local oscillator including a voltage-controlled oscillator generating a reference signal and a frequency converter mixing the reference signal generated by the local oscillator with a transmitted signal or a received signal thereby converting the frequency of the transmitted signal or the received signal to a prescribed frequency, while the voltage-controlled oscillator includes an oscillation part performing oscillation, a resonance circuit resonating with the oscillation frequency of the oscillation part and a modulation circuit for modulating the oscillation frequency of the oscillation part within an oscillation band by changing the resonance frequency of the resonance circuit, the modulation circuit includes a pair of coupling parts coupled with the resonance circuit in a high-frequency manner and a variable capacitive element having a pair of electrodes subjected to application of a control voltage, and the pair of electrodes of the variable capacitive element are connected to the pair of coupling parts respectively.

In the voltage-controlled oscillator of this communication device, the pair of coupling parts of the modulation circuit are coupled with the resonance circuit in a high-frequency manner. When power oscillating at a constant oscillation frequency partially reaches the pair of coupling parts of the modulation circuit, therefore, a voltage resulting from the oscillation power is equally supplied to the pair of electrodes of the variable capacitive element. Thus, the potential difference between the pair of electrodes of the variable capacitive element is kept constant and the capacitance value of the capacitive element does not fluctuate. Therefore, the oscillation frequency does not fluctuate, not to deteriorate phase noise characteristics as a result.

The potential difference between the pair of electrodes of the variable capacitive element is kept constant, whereby baseband noise of the oscillation part and the variable capacitive element is prevented from being converted to a frequency around the oscillation frequency due to nonlinearity between the capacitance value of the variable capacitive element and a voltage, not to deteriorate phase noise characteristics of oscillating waves as a result. Accordingly, a deterioration in a communication quality resulting from a deterioration in phase noise characteristics in the communication device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing an exemplary structure of a voltage-controlled oscillator according to the present invention;

DESCRIPTION OF THE PREFERRED EMBODIMENTS

Figure 2:
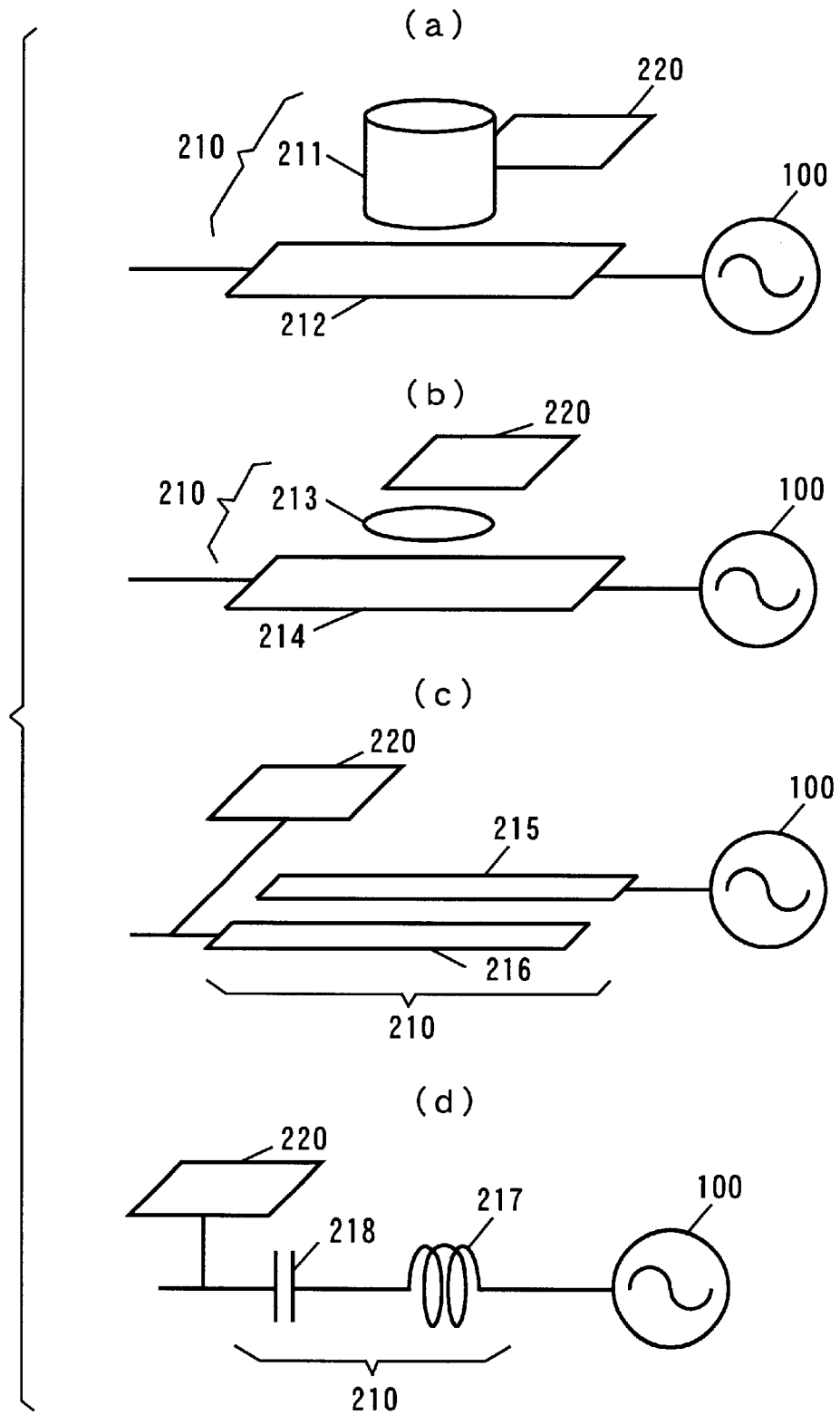
FIGS. 2(a) to 2(d) are model diagrams showing exemplary structures of a resonance circuit of a resonance part shown in FIG. 1.

FIG. 1 is a block diagram showing an exemplary structure of a voltage-controlled oscillator according to the present invention.

The voltage-controlled oscillator shown in FIG. 1 is formed by an oscillation part 100, a resonance part 200 and a terminating circuit 300. The oscillation part 100, including an amplification circuit 110 and a feedback circuit 120, performs oscillation. The resonance part 200, including a resonance circuit 210 and a modulation circuit 220, improves performance (phase noise characteristics) and a function (frequency variation). The amplification circuit 110 is connected with an output circuit 400 at need.

The amplification circuit 110 is formed by a transistor and a bias application circuit for the transistor. The band of the bias application circuit is limited to reject passage of a prescribed frequency (oscillation frequency). The feedback circuit 120, forming a feedback loop with the amplification circuit 110, feeds back an output signal from the amplification circuit 110 to the input side in phase and grows oscillation.

The resonance circuit 210, including a resonance element, limits the frequency of oscillating waves to a narrow band and reduces phase noise for improving the purity of the oscillating waves. The modulation circuit 220 is formed by a variable capacitive element, a bias application circuit for the variable capacitive element and a coupling part with the resonance circuit 210. The modulation circuit 220 is coupled with the resonance circuit 210 and changes the resonance frequency of the resonance circuit 210 thereby modulating the oscillation frequency.

The terminating circuit 300 consumes power of a frequency other than the oscillation frequency as heat and stabilizes the oscillation. The output circuit 400 is formed by a capacitor for removing a dc component, an attenuator for reducing load fluctuation and the like.

FIGS. 2(a) to 2(d) are model diagrams showing exemplary structures of the resonance circuit 210 of the resonance part 200 shown in FIG. 1.

In the example shown in FIG. 2(a), the resonance circuit 210 is formed by a dielectric cylinder 211. The dielectric cylinder 211 is electromagnetically coupled with a microstrip line 212 connected with the oscillation part 100 and the modulation circuit 220. In this case, the dielectric cylinder 211 serves as the resonance element.

In the example shown in FIG. 2(b), the resonance circuit 210 is formed by a metal disc 213. The metal disc 213 is electromagnetically coupled with a microstrip line 214 connected with the oscillation part 100 and the modulation circuit 220. In this case, the metal disc 213 serves as the resonance element.

In the example shown in FIG. 2(c), the resonance circuit 210 is formed by microstrip lines 215 and 216 arranged in parallel with each other. The microstrip line 215 is connected with the oscillation part 100, while the other microstrip line 216 is connected with the modulation circuit 220. In this case, the two microstrip lines 215 and 216 serve as the resonance element. The resonance element of this resonance circuit 210 is formed by a distributed constant circuit.

In the example shown in FIG. 2(d), the resonance circuit 210 is formed by an inductor 217 and a capacitor 218 serially connected with each other. The inductor 217 is connected with the oscillation part 100, while the capacitor 218 is connected with the modulation circuit 220. In this case, the inductor 217 and the capacitor 218 serve as the resonance element. The resonance element of this resonance circuit 210 is formed by a lumped constant circuit.

The example shown in FIG. 2(a) is applied to a resonance circuit 210 of a voltage-controlled oscillator according to each of first and second embodiments of the present invention described later. The example shown in FIG. 2(c) is applied to a resonance circuit 210 of a voltage-controlled oscillator according to a third embodiment of the present invention described later. The example shown in FIG. 2(d) is applied to a resonance circuit 210 of a voltage-controlled oscillator according to a fourth embodiment of the present invention described later.

Figure 3:
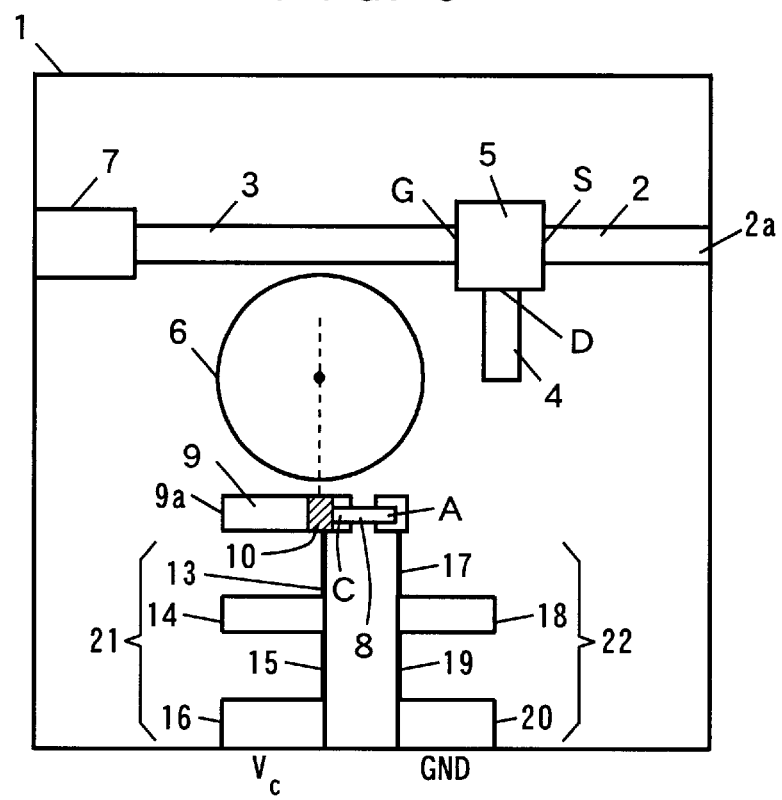
FIG. 3 is a plan view of a voltage-controlled oscillator according to a first embodiment of the present invention.
Figure 4:
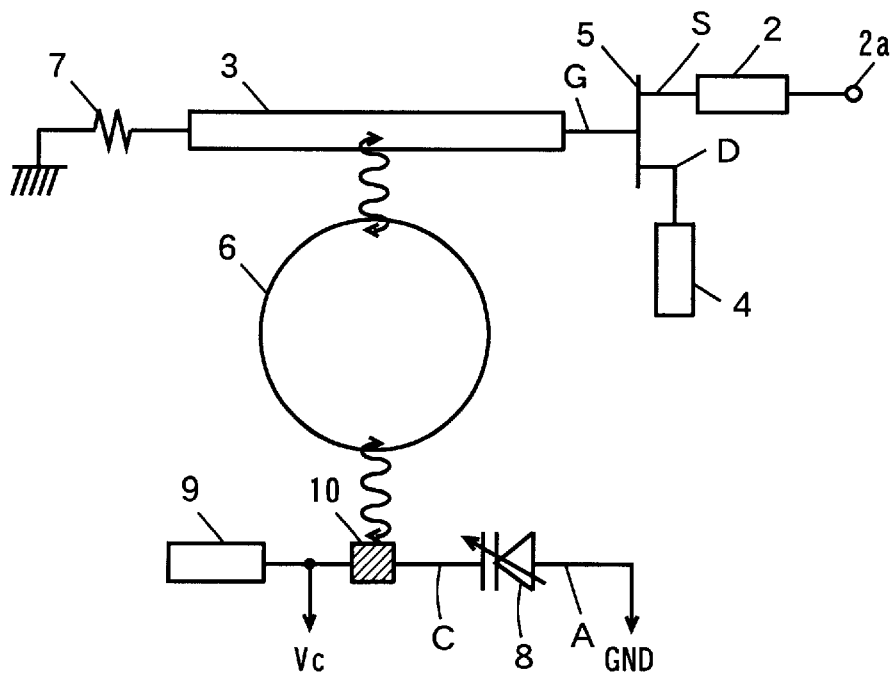
FIG. 4 is a circuit diagram of the voltage-controlled oscillator shown in FIG. 3.

FIG. 3 is a plan view of the voltage-controlled oscillator according to the first embodiment of the present invention, and FIG. 4 is a circuit diagram of the voltage-controlled oscillator shown in FIG. 3. In the following description, it is assumed that $f_0$ represents the center oscillation frequency of an oscillation band of the voltage-controlled oscillator. It is also assumed that $\lambda_g$ represents an effective wavelength corresponding to the oscillation frequency $f_0$.

Referring to FIG. 3, a metal-semiconductor field-effect transistor (MESFET; hereinafter referred to as a transistor) 5 of GaAs is formed on a dielectric substrate 1. A grounding conductor is formed on the rear surface of the dielectric substrate 1. An output microstrip line 2, a gate-side feedback microstrip line 3 and a drain-side feedback microstrip line 4 connected with a source electrode S, a gate electrode G and a drain electrode D of the transistor 5 respectively are formed on the dielectric substrate 1. An end of the microstrip line 2 defines an output node 2a. A terminating resistor 7 is connected to an end of the microstrip line 3.

Further, a dielectric resonator 6 is arranged on the dielectric substrate 1 to be electromagnetically (spatially) coupled with the microstrip line 3. A coupling microstrip line 9 is formed on the dielectric substrate 1 to be electromagnetically coupled with the dielectric resonator 6. A first end of the microstrip line 9 is open to define an open end 9a. A portion around a second end of the microstrip line 9 is arranged to approximate to the dielectric resonator 6, thereby defining a node 10.

The length between the open end 9a and the node 10 of the microstrip line 9 is substantially set to a quarter of the effective wavelength $\lambda_g$ (this length is hereinafter referred to as $\lambda_g/4$). In practice, however, the length between the open end 9a and the node 10 of the microstrip line 9 is set shorter than $\lambda_g/4$ as described later.

A cathode C of a varactor diode 8 is connected to the node 10 of the microstrip line 9 or in the vicinity thereof. A bias application circuit 21 is connected to the cathode C of the varactor diode 8. The bias application circuit 21 is formed by microstrip lines 13 and 15 having high impedances, a microstrip line 14 having a low impedance and a pad electrode 16. A positive control voltage $V_c$ is applied to the pad electrode 16.

An anode A of the varactor diode 8 is connected with a bias application circuit 22. The bias application circuit 22 is formed by microstrip lines 17 and 19 having high impedances, a microstrip line 18 having a low impedance and a pad electrode 20. The pad electrode 20 is held at a ground potential GND serving as a reference potential.

The bias application circuits 21 and 22 serve as a band rejection filter rejecting passage of a high frequency of an oscillation band. Thus, the control voltage $V_c$ and the ground potential GND are applied to the cathode C and the anode A of the varactor diode 8 respectively while microwave power oscillating at the oscillation frequency is prevented from leakage.

In the voltage-controlled oscillator shown in FIG. 3, the transistor 5 and a bias application circuit (not shown) form the amplification circuit 110 shown in FIG. 1, and the microstrip lines 3 and 4 form the feedback circuit 120. The dielectric resonator 6 and the portion electromagnetically coupled with the microstrip line 3 form the resonance circuit 210, while the microstrip line 9 and the varactor diode 8 form the modulation circuit 220. Further, the terminating resistor 7 forms the terminating circuit 300.

As shown in FIG. 4, the microstrip line 3 and the dielectric resonator 6 are electromagnetically coupled with each other. Further, the dielectric resonator 6 and the node 10 of the microstrip line 9 are electromagnetically coupled with each other.

Oscillation of the voltage-controlled oscillator shown in FIG. 3 is now described. The transistor 5 amplifies a small microwave signal generated from the gate electrode G and outputs the amplified microwave signal to the drain electrode D. The microwave signal output to the drain electrode D is totally reflected by an open end of the microstrip line 4 and fed back to the gate electrode G through each capacitance among the drain electrode D, the source electrode S and the gate electrode G.

At this time, the microstrip line 3 and the dielectric resonator 6 serve a band rejection filter rejecting passage of a signal of the oscillation band. Thus, only a part of the fed-back microwave signal in the rejection band of the band rejection filter is totally reflected to form a loop fed back to the gate electrode G. The length of the microstrip line 4 and the portion electromagnetically coupling the microstrip line 3 and the dielectric resonator 6 with each other are so set that the feedback loop is of positive feedback at a desired oscillation frequency. Thus, microwave power oscillating at a constant oscillation frequency is obtained. This oscillation frequency is identical to the resonance frequency of the dielectric resonator 6. The terminating resistor 7 consumes the signal passing through the aforementioned band rejection filter as heat, thereby preventing oscillation at an unnecessary frequency.

Modulation of the voltage-controlled oscillator shown in FIG. 3 is now described. The control voltage $V_c$ is applied across the cathode C and the anode A of the varactor diode 8 through the bias application circuits 21 and 22. The capacitance value of the varactor diode 8 varies with the control voltage $V_c$ applied across the cathode C and the anode A.

The dielectric resonator 6 and the node 10 of the microstrip line 9 are electromagnetically coupled with each other, and hence the resonance frequency of the dielectric resonator 6 varies with the capacitance value of the varactor diode 8. Therefore, the oscillation frequency can be varied by changing the control voltage $V_c$.

In the voltage-controlled oscillator according to this embodiment, the length between the open end 9a and the node 10 of the microstrip line 9 is substantially set to $\lambda_g/4$, and hence the node 10 is grounded in a high-frequency manner. In other words, the input impedance of the node 10 of the microstrip line 9 is shorted (in a shorted state) as viewed from the side of the dielectric resonator 6 at the oscillation frequency $f_0$. Also when the microwave power oscillating at the oscillation frequency $f_0$ partially reaches the varactor diode 8 through the electromagnetic coupling between the dielectric resonator 6 and the microstrip line 9, therefore, the node 10 is inhibited from potential fluctuation. Thus, the potential difference between the cathode C and the anode A of the varactor diode 8 is kept constant and the varactor diode 8 is prevented from fluctuation of the capacitance value. Therefore, the oscillation frequency does not fluctuate, not to deteriorate phase noise characteristics as a result.

The potential difference between the cathode C and the anode A of the varactor diode 8 is kept constant, whereby baseband noise of the transistor 5 and the varactor diode 8 is prevented from being converted to a frequency around the oscillation frequency due to nonlinearity between the capacitance value of the varactor diode 8 and the voltage, not to deteriorate phase noise characteristics of oscillating waves as a result.

Figure 5:
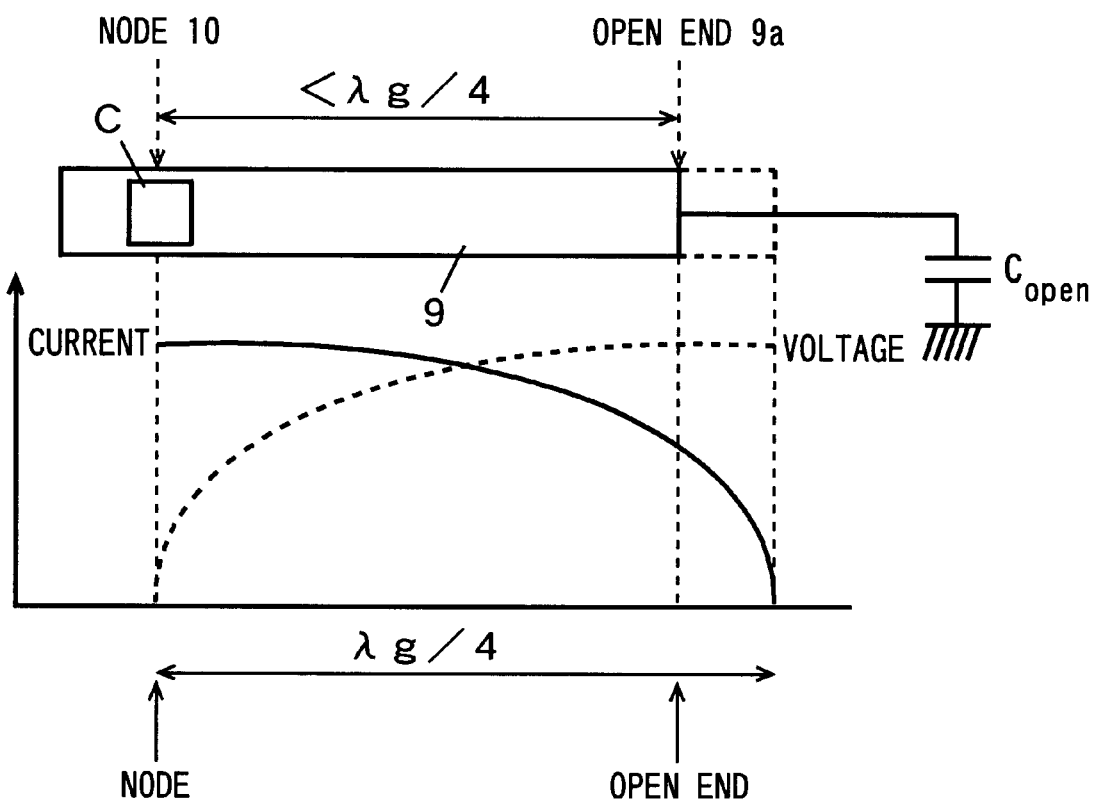
FIG. 5 is a diagram for illustrating the length between an open end and a node of a microstrip line in the voltage-controlled oscillator shown in FIG. 3.

FIG. 5 is a diagram for illustrating the length between the open end 9a and the node 10 of the microstrip line 9 in the voltage-controlled oscillator shown in FIG. 3.

As shown in FIG. 5, capacitance $C_{open}$ is present between the open end 9a of the microstrip line 9 and the grounding conductor on the rear surface of the dielectric substrate 1 (see FIG. 3). Thus, the effective length of the microstrip line 9 is extended as shown by broken lines. When reducing the length between the open end 9a and the node 10 of the microstrip line 9 below $\lambda_g/4$ in consideration of the capacitance $C_{open}$, therefore, the input impedance of the node 10 is shorted as viewed from the side of the dielectric resonator 6 shown in FIG. 3 at the oscillation frequency $f_0$.

In this case, the voltage is maximized on an open end of the effectively extended microstrip line 9 and minimized on the node 10. When matching the cathode C of the varactor diode 8 shown in FIG. 3 with the node 10 of the microstrip line 9, therefore, a voltage superposed on the control voltage $V_c$ on the cathode C of the varactor diode 8 by oscillation power reaches zero and the potential difference between the cathode C and the anode A is kept constant. Consequently, the oscillation frequency does not fluctuate and the phase noise characteristics are improved.

A current is minimized on the open end of the effectively extended microstrip line 9 and maximized on the node 10. Therefore, a portion around the node 10 is increased in magnetic flux density, to be readily electromagnetically coupled with the dielectric resonator 6 shown in FIG. 3. Thus, accuracy required for positioning the dielectric resonator 6 is relaxed.

Thus, the length between the open end 9a and the node 10 of the microstrip line 9 is preferably set shorter than $\lambda_g/4$ so that the length between the open end and the node 10 of the microstrip line 9 effectively extended due to the capacitance $C_{open}$ between the open end 9a of the microstrip line 9 and the grounding conductor on the rear surface of the dielectric substrate 1 is $\lambda_g/4$.

Figure 6:
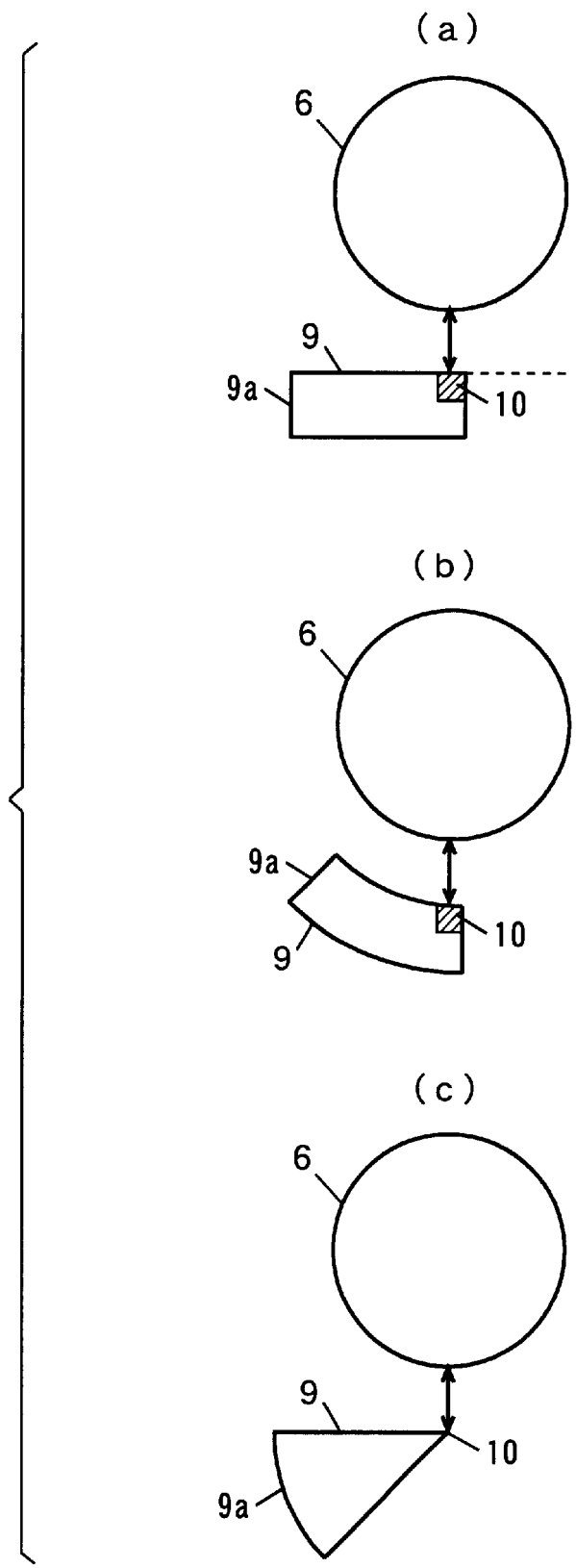
FIGS. 6(a) to 6(c) illustrate exemplary shapes of a microstrip line employed for the voltage-controlled oscillator shown in FIG. 3.

FIGS. 6(a) to 6(c) show exemplary shapes of the microstrip line 9 employed for the voltage-controlled oscillator shown in FIG. 3.

In the example shown in FIG. 6(a), the microstrip line 9 is in the form of a linear strip. In this case, the microstrip line 9 is electromagnetically coupled with the dielectric resonator 6 on the node 10 separate from the open end 9a by a prescribed distance. The length between the open end 9a and the node 10 of the microstrip line 9 is so set that the input impedance of the node 10 is shorted as viewed from the side of the dielectric resonator 6 at the oscillation frequency $f_0$, as described above.

In the example shown in FIG. 6(b), the microstrip line 9 is in the form of a strip concentric with the dielectric resonator 6. In this case, the microstrip line 9 is electromagnetically coupled with the dielectric resonator 6 on the node 10 separate from the open end 9a by a prescribed distance. The length between the open end 9a and the node 10 of the microstrip line 9 is so set that the input impedance of the node 10 is shorted as viewed from the side of the dielectric resonator 6 at the oscillation frequency $f_0$, as described above.

In the example shown in FIG. 6(c), the microstrip line 9 is in the form of a sector. In this case, the microstrip line 9 is electromagnetically coupled with the dielectric resonator 6 on the node 10 separate from the open end 9a by a prescribed distance. The length between the open end 9a and the node 10 of the microstrip line 9 is so set that the input impedance of the node 10 is shorted as viewed from the side of the dielectric resonator 6 at the oscillation frequency $f_0$, as described above.

The shape of the microstrip line 9 is not restricted to the above examples but the microstrip line 9 can be selected in an arbitrary shape capable of setting the input impedance of the node 10 in a shorted state as viewed from the side of the dielectric resonator 6 at the oscillation frequency $f_0$.

The dielectric resonator 6 in the resonance circuit 210 of the voltage-controlled oscillator shown in FIG. 3 may be replaced with the metal disc 213 shown in FIG. 2(b).

Figure 7:
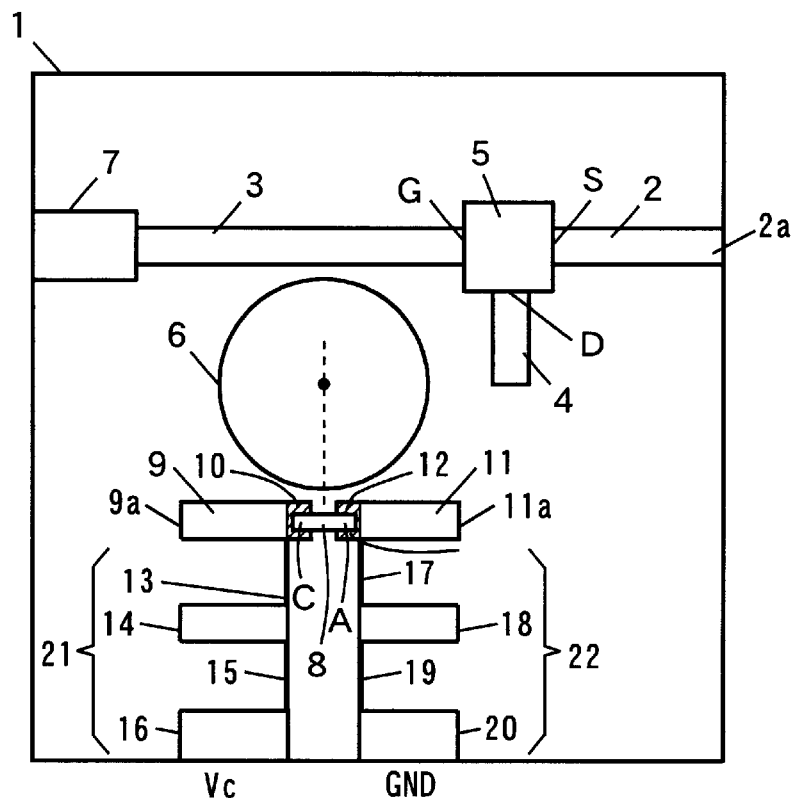
FIG. 7 is a plan view of a voltage-controlled oscillator according to a second embodiment of the present invention.
Figure 8:
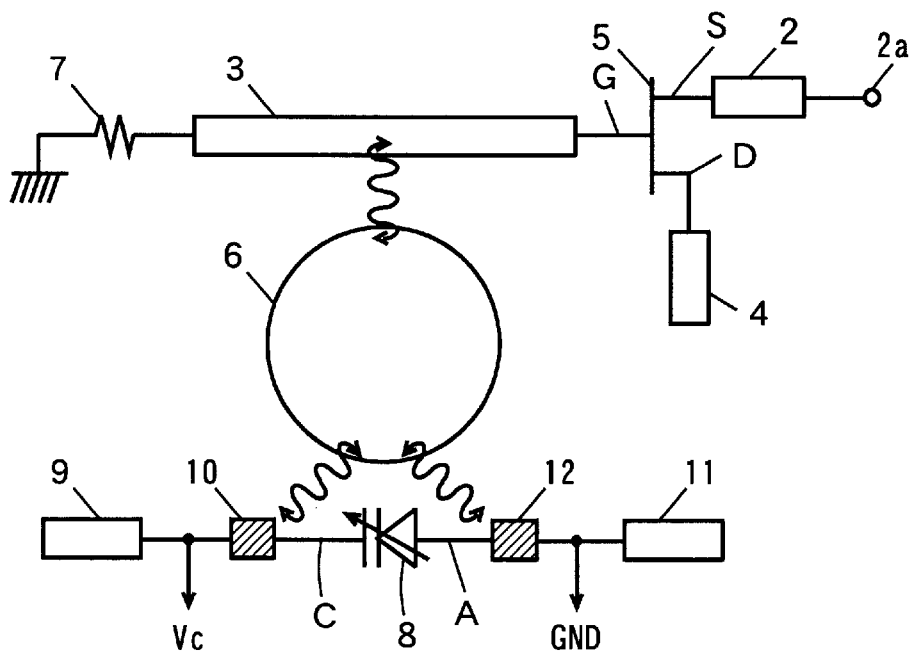
FIG. 8 is a circuit diagram of the voltage-controlled oscillator shown in FIG. 7.

FIG. 7 is a plan view of the voltage-controlled oscillator according to the second embodiment of the present invention, and FIG. 8 is a circuit diagram of the voltage-controlled oscillator shown in FIG. 7.

The structure of the voltage-controlled oscillator shown in FIG. 7 is similar to that of the voltage-controlled oscillator shown in FIG. 3 except the following point: In the voltage-controlled oscillator shown in FIG. 7, a coupling microstrip line 11 is further formed on a dielectric substrate 1 to be electromagnetically coupled with a dielectric resonator 6. A microstrip line 9 and the microstrip line 11 are arranged on positions symmetrical to each other about a line passing through the center point of the dielectric resonator 6.

A first end of the microstrip line 9 is open to define an open end 9a, while a first end of the microstrip line 11 is also open to define an open end 11a. A second end of the microstrip line 9 is arranged to approximate to the dielectric resonator 6 thereby defining a node 10, while a second end of the microstrip line 11 is also arranged to approximate to the dielectric resonator 6 thereby defining a node 12. The length between the open end 11a and the node 12 of the microstrip line 11 is substantially set to $\lambda_g/4$, similarly to the length between the open end 9a and the node 10 of the microstrip line 9. In practice, however, the length between the open end 11a and the node 12 of the microstrip line 11 is set shorter than $\lambda_g/4$ as shown in FIG. 5, similarly to the microstrip line 9.

A cathode C of a varactor diode 8 is connected to the node 10 of the microstrip line 9 or in the vicinity thereof, while an anode A of the varactor diode 8 is connected to the node 12 of the microstrip line 11 or in the vicinity thereof. The cathode C of the varactor diode 8 is connected with a bias application circuit 21, and the anode A is connected with a bias application circuit 22.

In the voltage-controlled oscillator shown in FIG. 7, the microstrip lines 9 and 11 and the varactor diode 8 form the modulation circuit 220. The structures of the remaining parts of the voltage-controlled oscillator shown in FIG. 7 are similar to those of the voltage-controlled oscillator shown in FIG. 3.

As shown in FIG. 8, a microstrip line 3 and the dielectric resonator 6 are electromagnetically coupled with each other. The dielectric resonator 6 and the node 10 of the microstrip line 9 are electromagnetically coupled with each other, while the dielectric resonator 6 and the node 12 of the microstrip line 11 are electromagnetically coupled with each other.

Oscillation of the voltage-controlled oscillator shown in FIG. 7 is similar to that of the voltage-controlled oscillator shown in FIG. 3. Modulation of the voltage-controlled oscillator shown in FIG. 7 is now described with reference to FIGS. 9(a) and 9(b).

Figure 9:
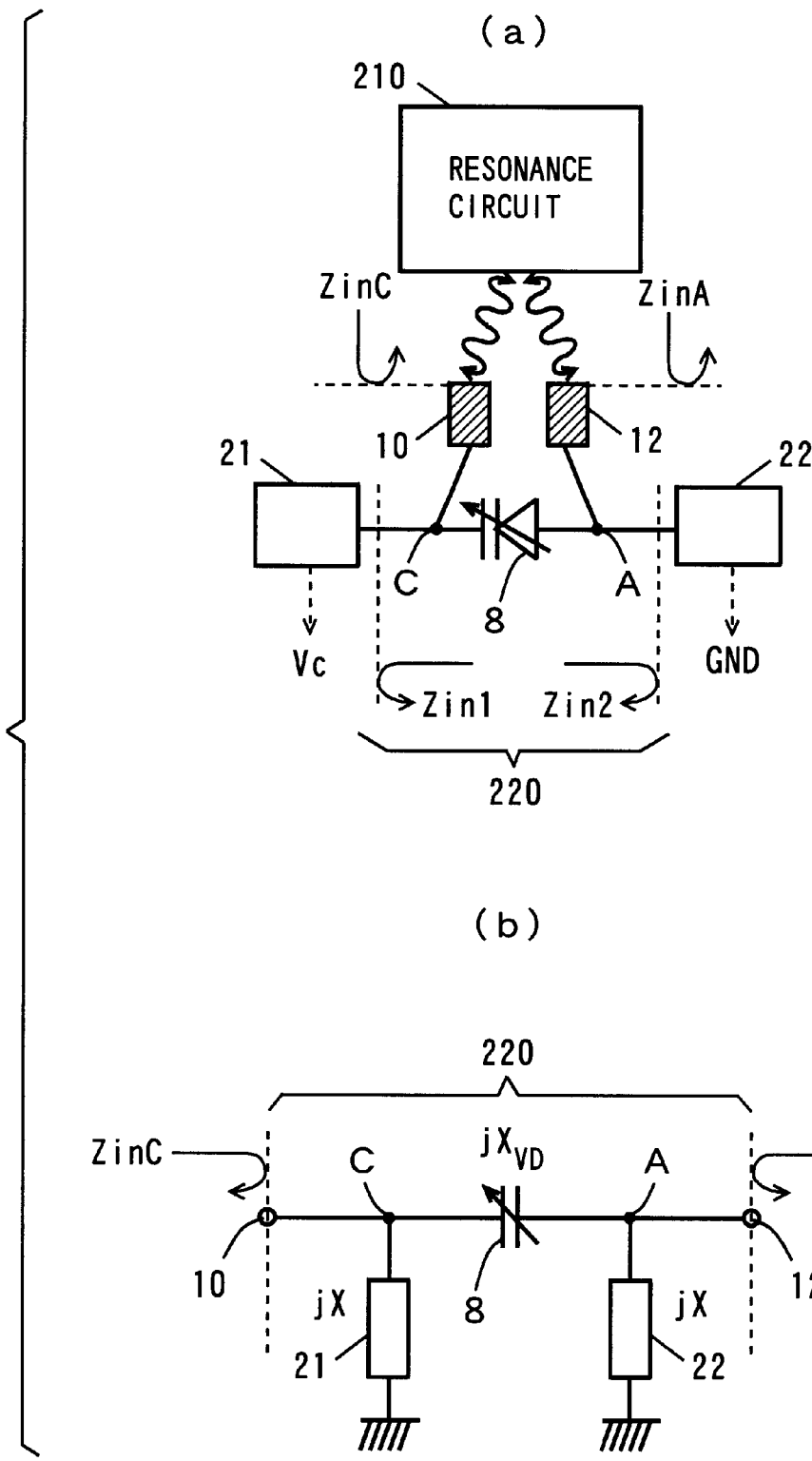
FIGS. 9(a) and 9(b) are a model diagram and a circuit diagram for illustrating coupling between a resonance circuit and a modulation circuit in the voltage-controlled oscillator shown in FIG. 7.

FIGS. 9(a) and 9(b) are a model diagram and a circuit diagram for illustrating coupling between the resonance circuit 210 and the modulation circuit 220 in the voltage-controlled oscillator shown in FIG. 7.

Referring to FIGS. 9(a) and 9(b), symbol ZinC denotes the input impedance of the node 10 of the microstrip line 9 as viewed from the side of the resonance circuit 210 at an oscillation frequency $f_0$ without taking the electromagnetic coupling between the node 12 and the resonance circuit 210 on the side of the anode A of the varactor diode 8 into consideration. Symbol ZinA denotes the input impedance of the node 12 of the microstrip line 11 as viewed from the side of the resonance circuit 210 at the oscillation frequency $f_0$ without taking the electromagnetic coupling between the node 10 and the resonance circuit 210 on the side of the cathode C of the varactor diode 8 into consideration. Symbol Zin1 denotes the input impedance of the bias application circuit 21 as viewed from the side of the varactor diode 8 at the oscillation frequency $f_0$, and symbol Zin2 denotes the input impedance of the bias application circuit 22 as viewed from the side of the varactor diode 8 at the oscillation frequency $f_0$. Symbol $jX_{VD}$ denotes the impedance of the varactor diode 8.

The bias application circuits 21 and 22 are so formed that the following equation holds at the oscillation frequency f0:

$$Zin1 = Zin2 = jX$$

In this case, the input impedance ZinC on the node 10 is expressed as follows:

$$ZinC = j\{X(X+X_{VD})\}/(2X+X_{VD}) \quad (1)$$

The input impedance ZinA on the node 12 is expressed as follows:

$$ZinA = j\{X(X+X_{VD})\}/(2X+X_{VD}) \quad (2)$$

When the control voltage Vc is changed for changing the capacitance value of the varactor diode 8, i.e., the impedance $jX_{VD}$ in the above equations (1) and (2), the input impedance ZinC on the node 10 and the input impedance ZinA on the node 12 change. Thus, the resonance frequency of the dielectric resonator 6 changes. Therefore, the oscillation frequency can be varied with the control voltage $V_c$.

In this case, ZinC=ZinA from the above equations (1) and (2), whereby a voltage resulting from oscillation power is equally supplied to the cathode C and the anode A when microwave power oscillating at a constant oscillation frequency partially reaches the varactor diode 8 through electromagnetic coupling between the dielectric resonator 6 and the microstrip lines 9 and 11. Therefore, the potential difference between the cathode C and the anode A of the varactor diode 8 is kept constant, so that the capacitance value of the varactor diode 8 does not fluctuate. Thus, the oscillation frequency does not fluctuate either, not to deteriorate phase noise characteristics as a result.

The potential difference between the cathode C and the anode A of the varactor diode 8 is kept constant, whereby baseband noise of the transistor 5 and the varactor diode 8 is prevented from being converted to a frequency around the oscillation frequency due to nonlinearity between the capacitance value of the varactor diode 8 and a voltage, not to deteriorate phase noise characteristics of oscillating waves as a result.

In particular, the length between the open end 9a and the node 10 of the microstrip line 9 and the length between the open end 11a and the node 12 of the microstrip line 11 are substantially set to $\lambda_g/4$ respectively in the voltage-controlled oscillator according to this embodiment, whereby the input impedances of the nodes 10 and 12 are respectively shorted as viewed from the side of the dielectric resonator 6 at the oscillation frequency f0. Also when different voltages are supplied to the nodes 10 and 12 of the microstrip lines 9 and 11 due to the oscillation power, therefore, the nodes 10 and 12 are inhibited from potential fluctuation and the potential difference between the cathode C and the anode A of the varactor diode 8 is also inhibited from fluctuation. Consequently, fluctuation of the capacitance value of the varactor diode 8 is suppressed.

When arranging the microstrip lines 9 and 11 so that the electromagnetic coupling between the dielectric resonator 6 and the node 10 of the microstrip line 9 and the electromagnetic coupling between the dielectric resonator 6 and the node 12 of the microstrip line 11 are equal to each other, the length between the open end 9a and the node 10 of the microstrip line 9 as well as the length between the open end 11a and the node 12 of the microstrip line 11 may be substantially set to a level different from $\lambda_g/4$. In this case, the voltage resulting from the oscillation power is equally supplied to the cathode C and the anode A, whereby the potential difference between the cathode C and the anode A of the varactor diode 8 is kept constant.

While the length between the open end 9a and the node 10 of the microstrip line 9 and the length between the open end 11a and the node 12 of the microstrip line 11 are identically set in the voltage-controlled oscillator according to this embodiment, the length between the open end 9a and the node 10 of the microstrip line 9 and the length between the open end 11a and the node 12 of the microstrip line 11 may alternatively be set to different values. In this case, the nodes 10 and 12 of the microstrip lines 9 and 11 are asymmetrically arranged about a line passing through the center point of the dielectric resonator 6.

The dielectric resonator 6 of the resonance circuit 210 of the voltage-controlled oscillator shown in FIG. 7 may be replaced with the metal disc 213 shown in FIG. 2(b).

Figure 10:
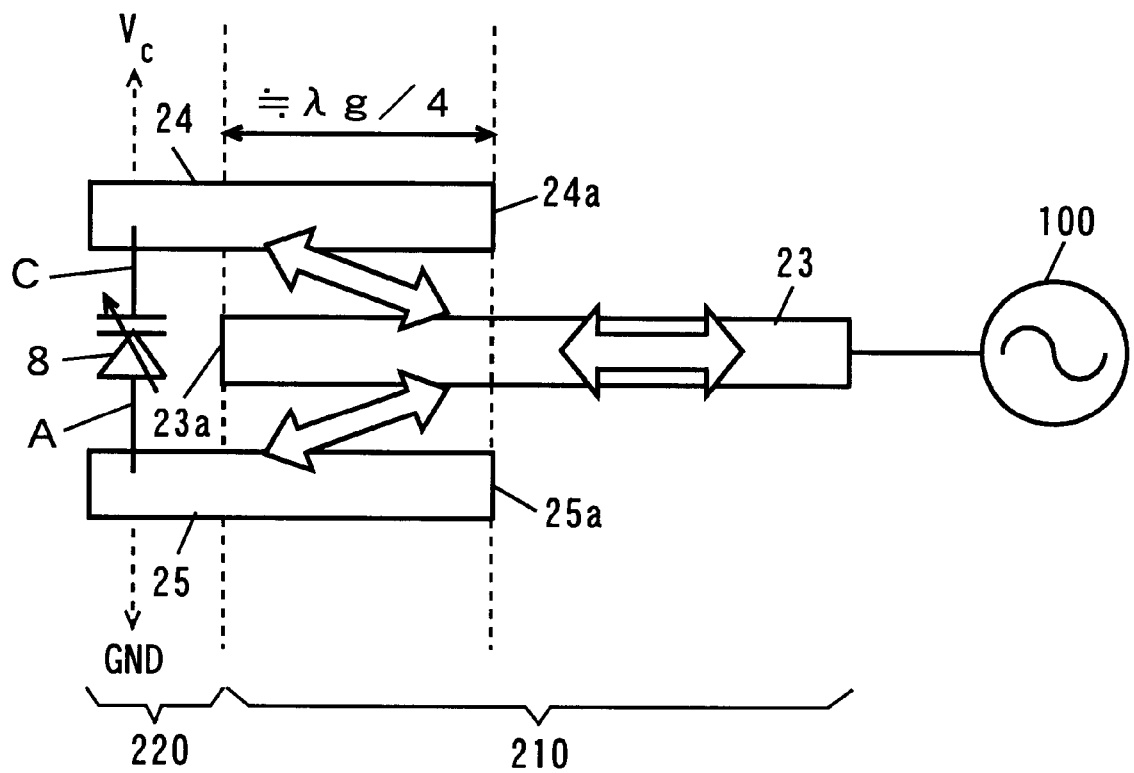
FIG. 10 is a plan view mainly showing a resonance circuit and a modulation circuit of a voltage-controlled oscillator according to a third embodiment of the present invention.

FIG. 10 is a plan view mainly showing the resonance circuit 210 and a modulation circuit 220 of the voltage-controlled oscillator according to the third embodiment of the present invention.

Referring to FIG. 10, the resonance circuit 210 is formed by microstrip lines 23, 24 and 25 arranged in parallel with each other. The microstrip lines 24 and 25 are arranged on positions symmetrical about the microstrip line 23 on both sides of the microstrip line 23.

A first end of the microstrip line 23 is connected to an oscillation part 100, and a second end is open to define an open end 23a. On the side opposite to the open end 23a of the microstrip line 23, a first end of the microstrip line 24 is open to define an open end 24a. A second end of the microstrip line 24 is connected with a cathode C of a varactor diode 8. On the side opposite to the open end 23a of the microstrip line 23, a first end of the microstrip line 25 is open to define an open end 25a. A second end of the microstrip line 25 is connected with an anode A of the varactor diode 8.

The microstrip line 23 is adjacent to the microstrip lines 24 and 25 in the range of a length of about $\lambda_g/4$ from the open end 23a of the microstrip line 23 and in the range of lengths of about $\lambda_g/4$ from the open ends 24a and 25a of the microstrip lines 24 and 25. Thus, the microstrip lines 23, 24 and 25 serve as a directional coupler coupling a signal of an oscillation frequency $f_0$.

In practice, the lengths between the open end 23a of the microstrip line 23 and the open ends 24a and 25a of the microstrip lines 24 and 25 are set shorter than $\lambda_g/4$, as shown in FIG. 5.

The cathode C and the anode A of the varactor diode 8 are connected with bias application circuits (not shown) respectively, similarly to the voltage-controlled oscillator shown in FIG. 7.

Figure 11:
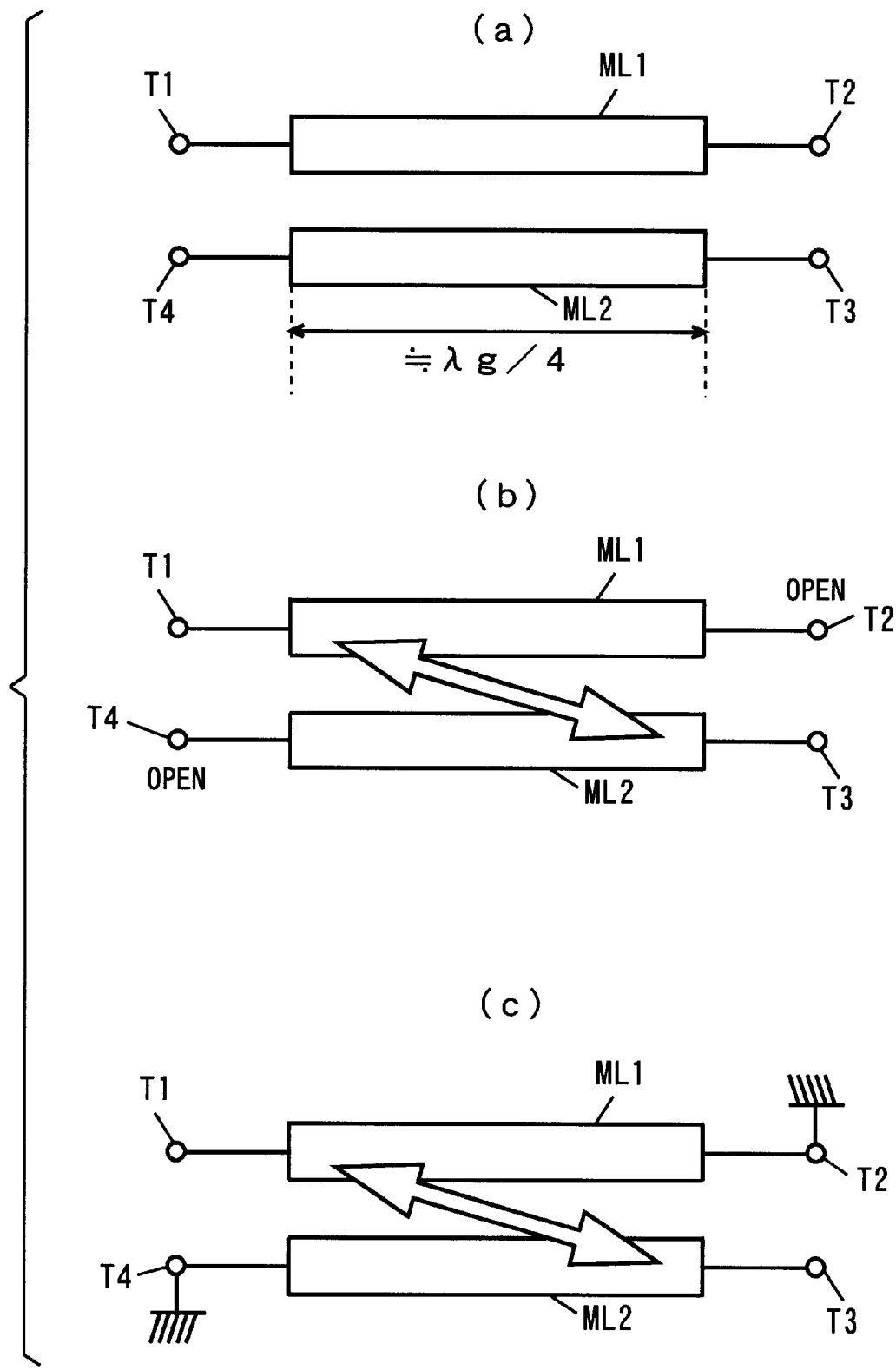
FIGS. 11(a) to 11(c) are diagrams for illustrating the operation principle of the resonance circuit shown in FIG. 10.

FIGS. 11(a) to 11(c) are diagrams for illustrating the operation principle of the resonance circuit 210 shown in FIG. 10.

As shown in FIG. 11(a), two microstrip lines ML1 and ML2 substantially having the length $\lambda_g/4$ are arranged in parallel with each other. When opening terminals T2 and T4 on diagonal positions of the microstrip lines ML1 and ML2 as shown in FIG. 11(b), the terminal T2 totally reflects a signal of the oscillation frequency $f_0$ on the microstrip line ML2 and the terminal T4 totally reflects a signal of the oscillation frequency $f_0$ on the microstrip line ML2. Thus, the microstrip lines ML1 and ML2 serve as a band-pass filter passing the signals of the oscillation frequency $f_0$ across terminals T1 and T3.

When shorting the terminals T2 and T4 on the diagonal positions of the microstrip lines ML1 and ML2 as shown in FIG. 11(c), the terminal T2 totally reflects the signal of the oscillation frequency $f_0$ on the microstrip line ML1 and the terminal T4 totally reflects the signal of the oscillation frequency $f_0$ on the microstrip line ML2. Thus, the microstrip lines ML1 and ML2 serve as a band-pass filter passing the signals of the oscillation frequency $f_0$ across the terminals T1 and T3.

In the resonance circuit 210 shown in FIG. 10, the microstrip lines 23 and 24 serve as a band-pass filter passing signals of the oscillation frequency $f_0$ and the microstrip lines 23 and 25 serve as a band-pass filter passing signals of the oscillation frequency $f_0$. Thus, the resonance circuit 210 is coupled to the cathode C and the anode A of the varactor diode 8. In this case, the microstrip lines 24 and 25 define coupling parts respectively.

In the voltage-controlled oscillator according to this embodiment, the cathode C and the anode A of the varactor diode 8 are symmetrically coupled with the microstrip lines 24 and 25 of the resonance circuit 210. Thus, when microwave power oscillating at a constant oscillation frequency partially reaches the varactor diode 8 through the microstrip lines 24 and 25, a voltage resulting from the oscillation power is equally supplied to the cathode C and the anode A. Therefore, the potential difference between the cathode C and the anode A of the varactor diode 8 is kept constant and the capacitance value of the varactor diode 8 does not fluctuate. Consequently, the oscillation frequency does not fluctuate either, not to deteriorate phase noise characteristics as a result.

The potential difference between the cathode C and the anode A of the varactor diode 8 is kept constant, whereby baseband noise of a transistor 5 and the varactor diode 8 is prevented from being converted to a frequency around the oscillation frequency due to nonlinearity between the capacitance value of the varactor diode 8 and the voltage, not to deteriorate phase noise characteristics of oscillating waves as a result.

While the microstrip lines 23, 24 and 25 coupled in parallel with each other form the resonance circuit 210 in this embodiment, the present invention is not restricted to this but the resonance circuit 210 may alternatively be formed by transmission lines such as short stubs serving as distributed constant elements.

Figure 12:
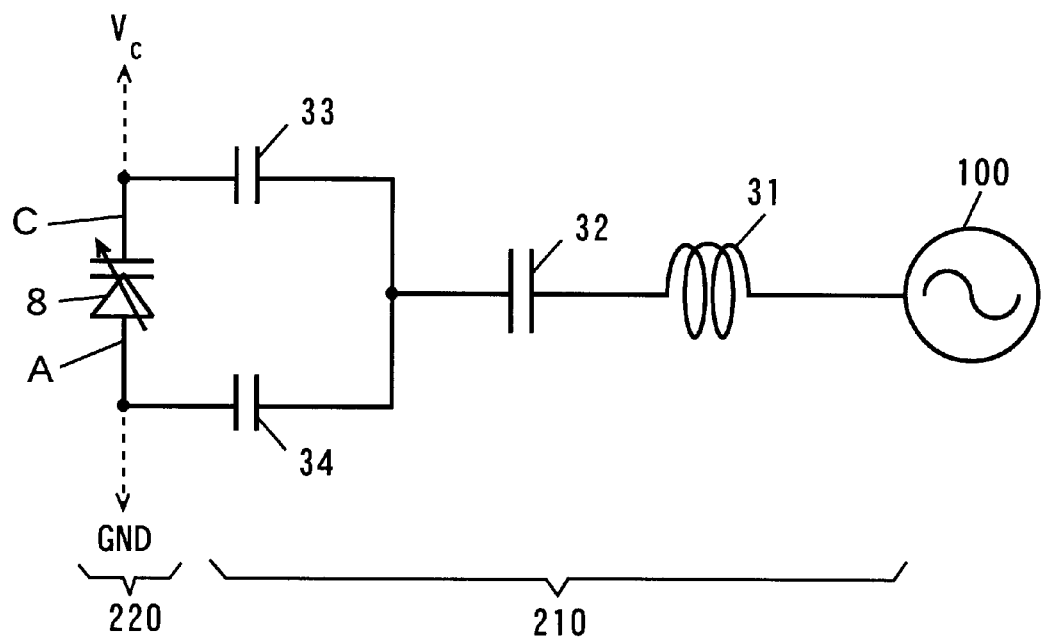
FIG. 12 is a plan view mainly showing a resonance circuit and a modulation circuit of a voltage-controlled oscillator according to a fourth embodiment of the present invention.

FIG. 12 is a circuit diagram mainly showing the resonance circuit 210 and a modulation circuit 220 of the voltage-controlled oscillator according to the fourth embodiment of the present invention.

Referring to FIG. 12, the resonance circuit 210 includes an inductor 31 and a capacitor 32 serially connected with each other. The inductor 31 is connected to an oscillation part 100. The capacitor 32 is connected to a cathode C and an anode A of a varactor diode 8 through large-capacitance capacitors 33 and 34 respectively. In this case, connected points between the capacitors 33 and 34 and the cathode C and the anode A of the varactor diode 8 define nodes respectively.

The cathode C and the anode A of the varactor diode 8 are connected with bias application circuits (not shown), similarly to the voltage-controlled oscillator shown in FIG. 7.

In the voltage-controlled oscillator according to this embodiment, the cathode C and the anode A of the varactor diode 8 are symmetrically connected with the capacitor 32 of the resonance circuit 210 through the capacitors 33 and 34 respectively. Thus, when microwave power oscillating at a constant oscillation frequency partially reaches the varactor diode 8 through the capacitors 33 and 34, a voltage resulting from the oscillation power is equally supplied to the cathode C and the anode A. Therefore, the potential difference between the cathode C and the anode A of the varactor diode 8 is kept constant and the capacitance value of the varactor diode 8 does not fluctuate. Consequently, the oscillation frequency does not fluctuate either, not to deteriorate phase noise characteristics as a result.

The potential difference between the cathode C and the anode A of the varactor diode 8 is kept constant, whereby baseband noise of a transistor 5 and the varactor diode 8 is prevented from being converted to a frequency around the oscillation frequency due to nonlinearity between the capacitance value of the varactor diode 8 and the voltage, not to deteriorate phase noise characteristics of oscillating waves as a result.

While the series-connected circuit of the inductor 31 and the capacitor 32 forms the resonance circuit 210 in this embodiment, the present invention is not restricted to this but the resonance circuit 210 may alternatively be formed by a parallel-connected circuit of an inductor and a capacitor or a combined circuit of series connection and parallel connection as a lumped constant element.

Further, the resonance circuit 210 may be formed by combining a distributed constant element and a lumped constant element. For example, the resonance circuit 210 may have a structure grounding open ends of transmission lines coupled in parallel with each other through capacitance.

While the voltage-controlled oscillator according to the present invention is formed by a hybrid integrated circuit (module) in each of the aforementioned embodiments, the inventive voltage-controlled oscillator can also be formed by a monolithic integrated circuit (on-chip).

Figure 13:
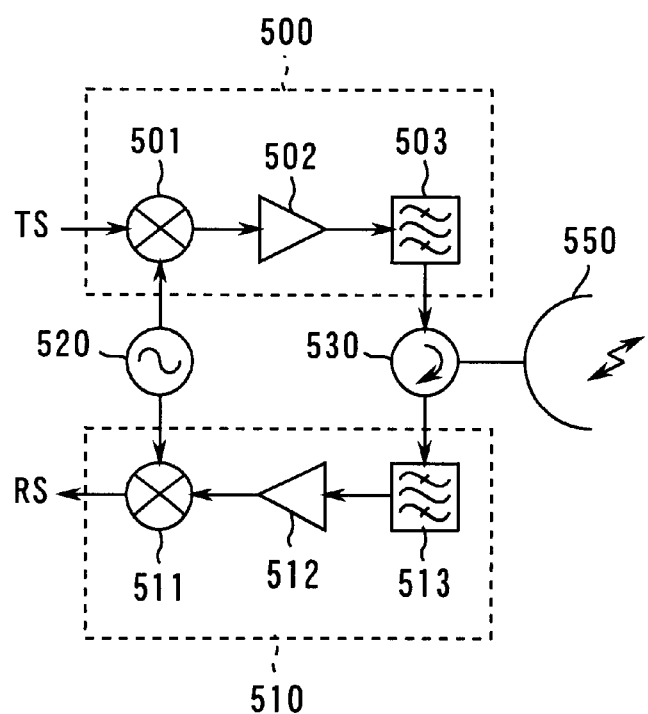
FIG. 13 is a model diagram showing the structure of a transmitter-receiver for a radio communication system employing the voltage-controlled oscillator shown in FIG. 1.
Figure 14:
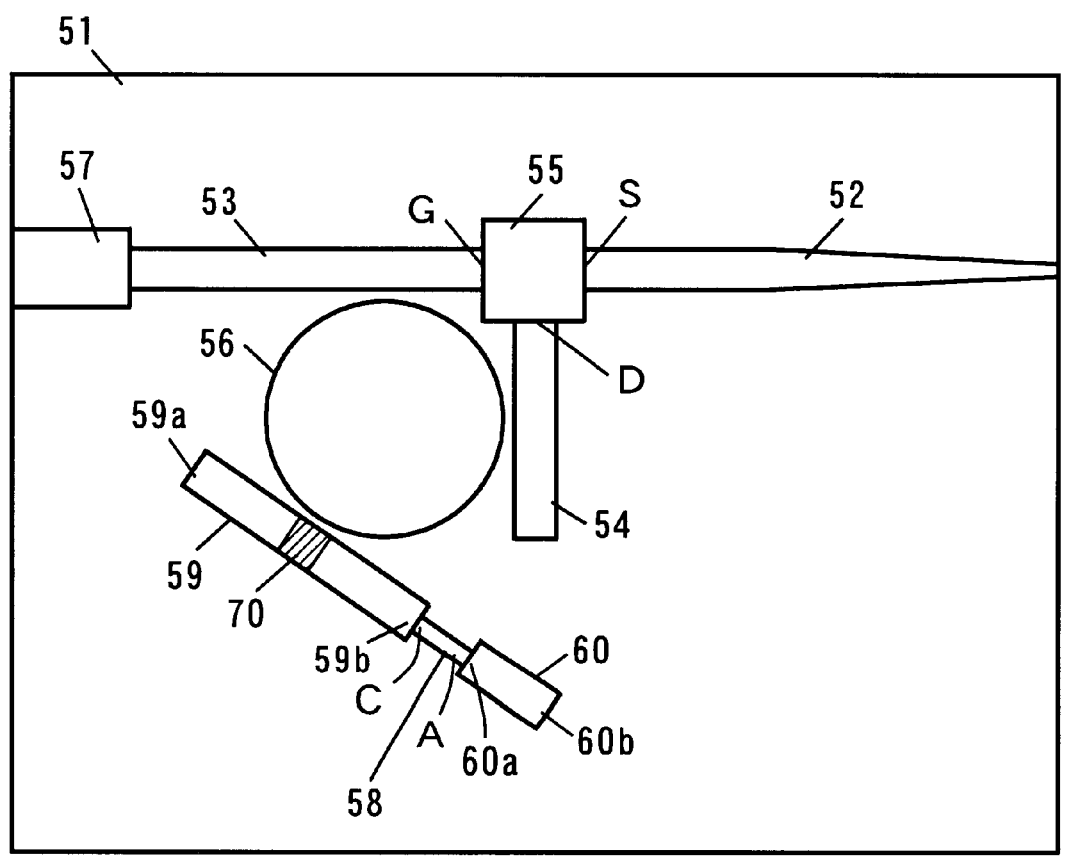
FIG. 14 is a plan view of a conventional voltage-controlled oscillator.

FIG. 13 is a model diagram showing the structure of a transmitter-receiver for a radio communication system employing the voltage-controlled oscillator shown in FIG. 1.

The transmitter-receiver shown in FIG. 13 is formed by a transmission system 500, a receiving system 510, a local oscillator 520, a signal path switch 530 and an antenna 550.

The transmission system 500 includes a frequency converter 501, an amplifier 502 and a band-pass filter 503. The receiving system 510 includes a frequency converter 511, an amplifier 512 and a band-pass filter 513. The local oscillator 520, formed by the voltage-controlled oscillator shown in FIG. 1, generates a reference signal of a prescribed frequency.

The frequency converter 501 of the transmission system 500 mixes a transmitted signal TS of a prescribed frequency with the reference signal generated from the local oscillator 520 thereby converting the transmitted signal TS to a transmitted signal having a high frequency. The amplifier 502 amplifies the transmitted signal obtained by the frequency converter 501. The band-pass filter 503 passes a part of a prescribed band in the transmitted signal amplified by the amplifier 502 and supplies the same to the antenna 550 through the signal path switch 530. Thus, the antenna 550 transmits a radio wave such as a microwave or a quasi-millimeter wave.

On the other hand, a radio wave such as a microwave or a quasi-millimeter wave received by the antenna 550 is supplied to the band-pass filter 513 of the receiving system 510 through the signal path switch 530. The band-pass filter 513 passes a received signal of a prescribed band included in the radio wave. The amplifier 512 amplifies the received signal passed through the band-pass filter 513. The frequency converter 511 mixes the received signal amplified by the amplifier 512 with the reference signal generated from the local oscillator 520 thereby converting the received signal to a received signal RS of a low frequency.

The transmitter-receiver shown in FIG. 13, employing the voltage-controlled oscillator shown in FIG. 1 as the local oscillator 520, attains excellent phase noise characteristics. As a result, the transmitter-receiver having a high communication quality is realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage-controlled oscillator comprising:
   an oscillation part performing oscillation;
   a resonance circuit resonating with the oscillation frequency of said oscillation part; and
   a modulation circuit for modulating the oscillation frequency of said oscillation part within an oscillation band by changing the resonance frequency of said resonance circuit, wherein
   said modulation circuit includes:
     a coupling part coupled with said resonance circuit in a high-frequency manner,
     a transmission line having an open end and said coupling part, the length between said open end and said coupling part of said transmission line being approximately set to odd times a quarter of an effective wavelength corresponding to a frequency within said oscillation band, and
     a variable capacitive element having a pair of electrodes subjected to application of a control voltage,
     wherein the input impedance of said coupling part as viewed from the side of said resonance circuit at a frequency within said oscillation band is substantially set in a shorted state while one of said pair of electrodes of said variable capacitive element is connected to said coupling part.

2. The voltage-controlled oscillator according to claim 1, wherein
   the length between said open end and said coupling part of said transmission line is set shorter than said odd times a quarter of said effective wavelength corresponding to said frequency within said oscillation band.

3. The voltage-controlled oscillator according to claim 2, wherein
   the length between said open end of said transmission line effectively extended due to capacitance present on said open end of said transmission line and said coupling part is set to odd times a quarter of said effective wavelength corresponding to said frequency within said oscillation band.

4. The voltage-controlled oscillator according to claim 1, wherein said variable capacitive element is a varactor diode.

5. The voltage-controlled oscillator according to claim 1, wherein said transmission line is a microstrip line.

6. A voltage-controlled oscillator comprising:
   an oscillation part performing oscillation;
   a resonance circuit resonating with an oscillation frequency of said oscillation part; and
   a modulation circuit for modulating the oscillation frequency of said oscillation part within an oscillation band by changing the resonance frequency of said resonance circuit, wherein
   said modulation circuit includes:
     a pair of coupling parts coupled with said resonance circuit in a high-frequency manner, and
     a variable capacitive element having a pair of electrodes subjected to application of a control voltage, and
     said pair of electrodes of said variable capacitive element are connected to said pair of coupling parts respectively,
     wherein the input impedances of said pair of coupling parts as viewed from the side of said resonance circuit at a frequency within said oscillation band are substantially set in shorted states respectively.

7. A voltage-controlled oscillator comprising:
   an oscillation part performing oscillation;
   a resonance circuit resonating with an oscillation frequency of said oscillation part; and
   a modulation circuit for modulating an oscillation frequency of said oscillation part within an oscillation band by changing the resonance frequency of said resonance circuit, wherein
   said modulation circuit includes:
     a pair of coupling parts coupled with said resonance circuit in a high-frequency manner, and
     a variable capacitive element having a pair of electrodes subjected to application of a control voltage, and
     said pair of electrodes of said variable capacitive element are connected to said pair of coupling parts respectively, and
     wherein said resonance circuit includes a resonance element formed by a cylindrical dielectric material or a discoidal conductive material, and
     said pair of coupling parts are electromagnetically coupled with said resonance element.

8. A voltage-controlled oscillator comprising:
   an oscillation part performing oscillation;
   a resonance circuit resonating with an oscillation frequency of said oscillation part; and
   a modulation circuit for modulating the oscillation frequency of said oscillation part within an oscillation band by changing the resonance frequency of said resonance circuit, wherein
   said modulation circuit includes:
     a pair of coupling parts coupled with said resonance circuit in a high-frequency manner, and
     a variable capacitive element having a pair of electrodes subjected to application of a control voltage, said pair of electrodes being connected to said pair of coupling parts respectively, and
     a pair of transmission lines, wherein
     the first one of said pair of transmission lines has an open end and the first one of said pair of coupling parts, and
     the second one of said pair of transmission lines has an open end and the second one of said pair of coupling parts.

9. The voltage-controlled oscillator according to claim 8, wherein
the length between said open end and said first coupling part of said first transmission line is equal to the length between said open end and said second coupling part of said second transmission line.

10. The voltage-controlled oscillator according to claim 8, wherein
the length between said open end and said first coupling part of said first transmission line is different from the length between said open end and said second coupling part of said second transmission line.

11. The voltage-controlled oscillator according to claim 6, wherein
said resonance circuit includes a distributed constant element.

12. The voltage-controlled oscillator according to claim 6, wherein
said resonance circuit includes a lumped constant element.

13. The voltage-controlled oscillator according to claim 6, wherein
said variable capacitive element is a varactor diode.

14. The voltage-controlled oscillator according to claim 8, wherein
said transmission lines are microstrip lines.

15. A communication device comprising:
a local oscillator including a voltage-controlled oscillator generating a reference signal; and
a frequency converter mixing said reference signal generated by said local oscillator with a transmitted signal or a received signal thereby converting the frequency of said transmitted signal or said received signal to a prescribed frequency, wherein
said voltage-controlled oscillator includes:
an oscillation part performing oscillation,
a resonance circuit resonating with the oscillation frequency of said oscillation part, and
a modulation circuit for modulating the oscillation frequency of said oscillation part within an oscillation band by changing the resonance frequency of said resonance circuit,
said modulation circuit includes:
a coupling part coupled with said resonance circuit in a high-frequency manner, and
a variable capacitive element having a pair of electrodes subjected to application of a control voltage, and
the input impedance of said coupling part as viewed from the side of said resonance circuit at a frequency within said oscillation band is substantially set in a shorted state while one of said pair of electrodes of said variable capacitive element is connected to said coupling part,
said modulation circuit further including a transmission line having an open end and said coupling part, and the length between said open end and said coupling part of said transmission line being approximately set to odd times a quarter of an effective wavelength corresponding to a frequency within said oscillation band.

16. A communication device comprising:
a local oscillator including a voltage-controlled oscillator generating a reference signal; and
a frequency converter mixing said reference signal generated by said local oscillator with a transmitted signal or a received signal thereby converting the frequency of said transmitted signal or said received signal to a prescribed frequency, wherein
said voltage-controlled oscillator includes:
an oscillation part performing oscillation,
a resonance circuit resonating with the oscillation frequency of said oscillation part, and
a modulation circuit for modulating the oscillation frequency of said oscillation part within an oscillation band by changing the resonance frequency of said resonance circuit,
said modulation circuit includes:
a pair of coupling parts coupled with said resonance circuit in a high-frequency manner, and
a variable capacitive element having a pair of electrodes subjected to application of a control voltage, and
said pair of electrodes of said variable capacitive element are connected to said pair of coupling parts respectively,
and the input impedances of said pair of coupling parts as viewed from the side of said resonance circuit at a frequency within said oscillation band are substantially set in shorted states respectively.

* * * * *